(12) United States Patent
Park et al.

(10) Patent No.: US 10,121,434 B2
(45) Date of Patent: Nov. 6, 2018

(54) STAGE CIRCUIT AND SCAN DRIVER USING THE SAME

(71) Applicant: Samsung Display Co., Ltd, Yongin-si, Gyeonggi-do (KR)

(72) Inventors: Jun Hyun Park, Yongin-si (KR); Sung Hwan Kim, Yongin-si (KR); Se Young Song, Yongin-si (KR); Kyoung Ju Shin, Yongin-si (KR); Jae Keun Lim, Yongin-si (KR)

(73) Assignee: Samsung Display Co., Ltd. (KR)

( * ) Notice: Subject to any disclaimer, the term of this patent is extended or adjusted under 35 U.S.C. 154(b) by 163 days.

(21) Appl. No.: 15/042,029

(22) Filed: Feb. 11, 2016

(65) Prior Publication Data

US 2016/0307537 A1    Oct. 20, 2016

(30) Foreign Application Priority Data

Apr. 14, 2015    (KR) .......................... 10-2015-0052531

(51) Int. Cl.
| | |
|---|---|
| G11C 19/00 | (2006.01) |
| G09G 3/36 | (2006.01) |
| G09G 3/20 | (2006.01) |
| G11C 19/28 | (2006.01) |
| H03K 17/687 | (2006.01) |

(52) U.S. Cl.
CPC ............ *G09G 3/3677* (2013.01); *G09G 3/20* (2013.01); *G11C 19/28* (2013.01); *G09G 2300/0465* (2013.01); *G09G 2310/0267* (2013.01); *G09G 2310/0286* (2013.01); *G09G 2310/0289* (2013.01); *H03K 17/6871* (2013.01)

(58) Field of Classification Search
None
See application file for complete search history.

(56) References Cited

U.S. PATENT DOCUMENTS

| | | | | |
|---|---|---|---|---|
| 8,351,563 | B2 * | 1/2013 | Yang | ..................... G09G 3/3677 377/64 |
| 9,087,596 | B2 * | 7/2015 | Su | ......................... G09G 3/3659 |
| 2009/0321731 | A1 | 12/2009 | Jeong et al. | |
| 2009/0321732 | A1 | 12/2009 | Kim et al. | |
| 2010/0054392 | A1 * | 3/2010 | Chen | ...................... G11C 19/28 377/79 |
| 2010/0260312 | A1 * | 10/2010 | Tsai | ...................... G09G 3/3677 377/79 |

(Continued)

FOREIGN PATENT DOCUMENTS

KR    10-2014-0051136 A    4/2014

*Primary Examiner* — Tuan T Lam
(74) *Attorney, Agent, or Firm* — Innovation Counsel LLP

(57) ABSTRACT

There is provided a stage circuit capable of minimizing a mounting area. The stage circuit includes: an output unit configured to supply a voltage of a first node, an i-th (i is a natural number) carry signal, and to supply an i-th scan signal in response to the voltage of the first node, a voltage of a second node, and a first clock signal, a controller configured to control the voltage of the second node in response to the first clock signal; a pull-up unit configured to control the voltage of the first node in response to a carry signal of a previous stage and a voltage of a first node of the previous stage, and a pull-down unit configured to control the voltage of the first node in response to the voltage of the second node and a carry signal of a next stage.

14 Claims, 12 Drawing Sheets

(56) References Cited

U.S. PATENT DOCUMENTS

| | | | |
|---|---|---|---|
| 2011/0150169 A1* | 6/2011 | Lin | G11C 19/28 377/64 |
| 2011/0193083 A1 | 8/2011 | Kim et al. | |
| 2012/0008731 A1* | 1/2012 | Hsu | G11C 19/28 377/79 |
| 2012/0140871 A1* | 6/2012 | Yang | G09G 3/20 377/79 |
| 2012/0153278 A1 | 6/2012 | Jeong et al. | |
| 2013/0181747 A1* | 7/2013 | Yoon | G11C 19/184 327/108 |
| 2013/0335392 A1 | 12/2013 | Cho et al. | |
| 2014/0064439 A1 | 3/2014 | Qing et al. | |
| 2014/0092078 A1* | 4/2014 | Yoon | G09G 5/001 345/212 |
| 2015/0042689 A1* | 2/2015 | Kim | H03K 3/012 345/690 |
| 2015/0206190 A1* | 7/2015 | Lee | H04W 48/16 705/14.64 |
| 2015/0228240 A1* | 8/2015 | Ahn | H03K 17/284 345/213 |
| 2016/0019828 A1* | 1/2016 | Lin | G09G 3/20 345/214 |
| 2016/0204136 A1* | 7/2016 | Takeuchi | H01L 27/1225 345/213 |
| 2016/0293094 A1* | 10/2016 | Park | H03K 17/6871 |
| 2016/0358573 A1* | 12/2016 | Takeuchi | G09G 3/3677 |

\* cited by examiner

STAGE CIRCUIT AND SCAN DRIVER USING THE SAME

CROSS-REFERENCE TO RELATED APPLICATION

This application claims priority to and the benefit of Korean Patent Application No. 10-2015-0052531, filed on Apr. 14, 2015, in the Korean Intellectual Property Office, the entire contents of which are incorporated herein by reference in their entirety.

BACKGROUND

1. Field

An embodiment of the present disclosure relates to a stage circuit and a scan driver using the same, and more particularly, to a stage circuit capable of minimizing a mounting area and a scan driver using the same.

2. Description of the Related Art

With the development of information technology (IT), the use of a display device such as a liquid crystal display device (LCD), an organic light emitting display device (OLED), and a plasma display panel (PDP) is increasing. In general, a display device includes a data driver for supplying data signals to data lines, a scan driver for supplying scan signals to scan lines, and a pixel unit including pixels positioned in regions divided by the scan lines and the data lines.

The pixels included in the pixel unit are selected when the scan signals are supplied to the scan lines and receive the data signals from the data lines. The pixels that receive the data signals supply light components with brightness components corresponding to the data signals to the outside.

The scan driver includes stages connected to the scan lines. The stages supply the scan signals to the scan lines connected thereto in response to signals from a timing controller. Each of the stages is formed of a p-type (for example, p-channel metal-oxide-semiconductor field-effect transistor (MOSFET) (PMOS) and/or n-channel MOSFET (NMOS) and may be mounted on a panel with the pixels. Because the stages mounted on the panel occupy a predetermined mounting area, a method of minimizing the mounting area of the stages is desirable.

SUMMARY

An embodiment of the present disclosure relates to a stage circuit capable of minimizing a mounting area and a scan driver using the same.

A stage circuit according to an embodiment of the present disclosure may include an output unit configured to supply a voltage of a first node to a first output terminal, to supply an i-th (i is a natural number) carry signal to a second output terminal, and to supply an i-th scan signal to a third output terminal in response to the voltage of the first node, a voltage of a second node, and a first clock signal supplied to a first input terminal, a controller configured to control the voltage of the second node in response to the first clock signal supplied to the first input terminal, a pull-up unit configured to control the voltage of the first node in response to a carry signal of a previous stage supplied to a second input terminal and a voltage of a first node of the previous stage supplied to a third input terminal, and a pull-down unit configured to control the voltage of the first node in response to the voltage of the second node and a carry signal of a next stage supplied to a fourth input terminal.

When the carry signal of the previous stage is supplied, the second input terminal may be set to have a lower voltage than that of the third input terminal.

The pull-up unit may include a first transistor having a first electrode connected to the second input terminal, a second electrode connected to the first node, and a gate electrode connected to the third input terminal.

The pull-up unit may further include a second transistor having a first electrode and a gate electrode connected to the second electrode of the first transistor and a second electrode connected to the first node and a third transistor having a first electrode connected to the second electrode of the first transistor and a gate electrode and a second electrode connected to the second output terminal.

The pull-up unit may further include a fourth transistor having a first electrode and a gate electrode connected to the second input terminal and a second electrode connected to the first electrode of the first transistor.

The pull-up unit may further include a second transistor having a first electrode and a gate electrode connected to the second electrode of the first transistor and a second electrode connected to the first node, a third transistor having a first electrode connected to the first electrode of the first transistor and a gate electrode and a second electrode connected to the second output terminal, and a fourth transistor having a first electrode and a gate electrode connected to the second input terminal and a second electrode connected to the first electrode of the first transistor.

The stage circuit may further include a first power source input terminal configured to receive a first off voltage and a second power source input terminal configured to receive a second off voltage different from the first off voltage.

The second off voltage may be set to be lower than the first off voltage.

The output unit may include a fifth transistor connected between the first input terminal and the second output terminal and having a gate electrode connected to the first node, a sixth transistor connected between the second output terminal and the second power source input terminal and having a gate electrode connected to the second node, a seventh transistor connected between the first input terminal and the third output terminal and having a gate electrode connected to the first node, an eighth transistor connected between the third output terminal and the first power source input terminal and having a gate electrode connected to the second node, and a ninth transistor connected between the third output terminal and the first power source input terminal and having a gate electrode connected to the fourth input terminal.

The controller may include a tenth transistor having a first electrode and a gate electrode connected to the first input terminal, an 11$^{th}$ transistor connected between a second electrode of the tenth transistor and the second power source input terminal and having a gate electrode connected to the second output terminal, a 12$^{th}$ transistor connected between the first input terminal and the second node and having a gate electrode connected to the second electrode of the tenth transistor, and a 13$^{th}$ transistor connected between the second node and the second power source input terminal and having a gate electrode connected to the second output terminal.

The pull-down unit may include a 14$^{th}$ transistor and a 15$^{th}$ transistor serially connected between the first node and the second power source input terminal and having gate electrodes connected to the second node, a 16$^{th}$ transistor connected between the second output terminal and the second power source input terminal and having a gate electrode connected to the fourth input terminal, and a $17^{th}$ transistor and an $18^{th}$ transistor serially connected between the first node and the second power source input terminal and having gate electrodes connected to the fourth input terminal.

A carry signal of the previous stage is an (i−1)-th carry signal and a carry signal of the next stage is an (i+1)-th carry signal.

A scan driver according to an embodiment of the present disclosure may include stages respectively connected to scan lines and outputting one of a plurality of clock signals input from an external source as scan signals. An i-th (i is a natural number) stage circuit among the stages includes an output unit configured to supply a voltage of a first node to a first output terminal, to supply an i-th carry signal to a second output terminal, and to supply an i-th scan signal to a third output terminal in response to the voltage of the first node, a voltage of a second node, and a first clock signal supplied to a first input terminal, a controller configured to control the voltage of the second node in response to the first clock signal supplied to the first input terminal, a pull-up unit configured to control the voltage of the first node in response to an (i−1)-th carry signal of a previous stage supplied to a second input terminal and a voltage of a first node of the previous stage supplied to a third input terminal, and a pull-down unit configured to control the voltage of the first node in response to the voltage of the second node and an (i+1)-th carry signal of a next stage supplied to a fourth input terminal.

When the (i−1)-th carry signal is supplied, the second input terminal may be set to have a lower voltage than that of the third input terminal.

The pull-up unit may include a first transistor having a first electrode connected to the second input terminal, a second electrode connected to the first node, and a gate electrode connected to the third input terminal.

The pull-up unit may further include a second transistor having a first electrode and a gate electrode connected to the second electrode of the first transistor and a second electrode connected to the first node and a third transistor having a first electrode connected to the second electrode of the first transistor and a gate electrode and a second electrode connected to the second output terminal.

The pull-up unit may further include a fourth transistor having a first electrode and a gate electrode connected to the second input terminal and a second electrode connected to the first electrode of the first transistor.

The pull-up unit may further include a second transistor having a first electrode and a gate electrode connected to the second electrode of the first transistor and a second electrode connected to the first node, a third transistor having a first electrode connected to the first electrode of the first transistor and a gate electrode and a second electrode connected to the second output terminal, and a fourth transistor having a first electrode and a gate electrode connected to the second input terminal and a second electrode connected to the first electrode of the first transistor.

In the stage circuit according to the embodiment of the present disclosure and the scan driver using the same, the voltage of the first node of the previous stage may be supplied to the pull-up unit so that sizes of the transistors mounted in the pull-up unit may be minimized.

In addition, according to exemplary embodiments of the present disclosure, the voltage between the first electrode and the second electrode of each of the one or more transistors included in the pull-up unit is minimized so that deteriorations of the transistors may be minimized. When the deteriorations of the transistors included in the pull-up unit are minimized, reliability of an operation may be secured.

BRIEF DESCRIPTION OF THE DRAWINGS

Example embodiments are described more fully hereinafter with reference to the accompanying drawings. The present system and method, however, may be embodied in different forms and should not be construed as being limited to the embodiments set forth herein. Rather, these embodiments are provided to help those of ordinary skill in the art understand and appreciate the teachings herein.

In the drawings, the dimensions of the figures may be exaggerated for clarity of illustration. It is understood that when an element is referred to as being "between" two elements, it may be the only element between the two elements, or one or more intervening elements may also be present. Like reference numerals refer to like elements throughout.

DETAILED DESCRIPTION

Figure 1:
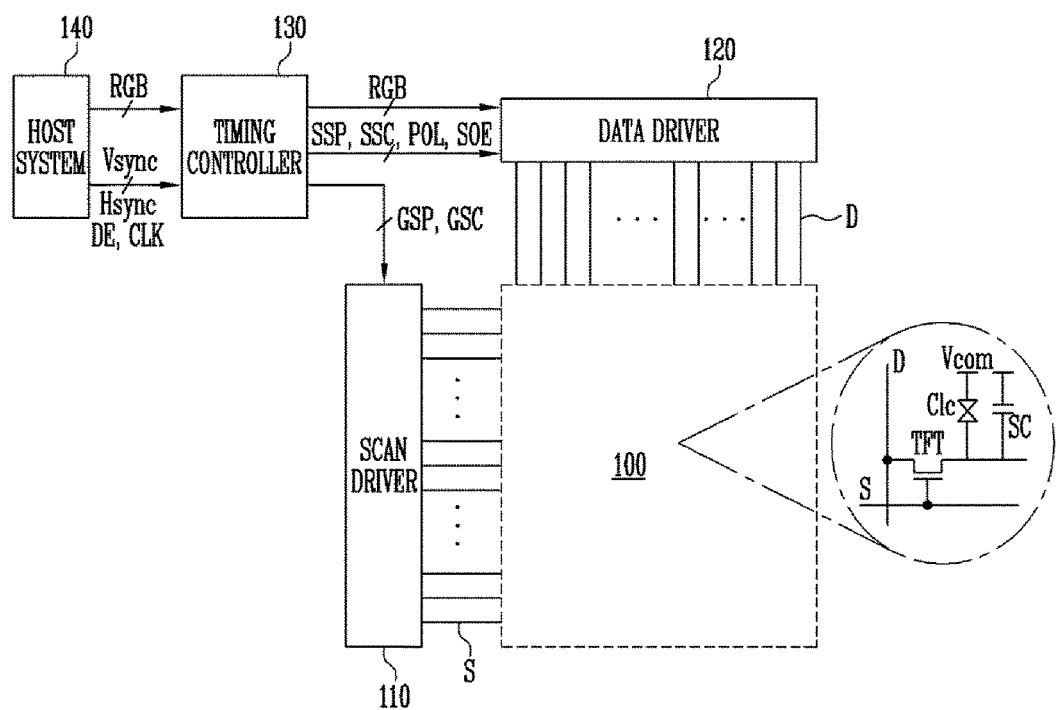
FIG. 1 is a block diagram schematically illustrating a display device according to an embodiment.

FIG. 1 is a block diagram schematically illustrating a display device according to an embodiment of the present disclosure. In FIG. 1, for convenience sake, it is assumed that the display device is a liquid crystal display device (LCD). However, the present disclosure is not limited thereto.

Referring to FIG. 1, the display device according to exemplary embodiments of the present disclosure includes a pixel unit 100, a scan driver 110, a data driver 120, a timing controller 130, and a host system 140.

The pixel unit 100, in this example, is a liquid crystal panel. The liquid crystal panel includes a thin film transistor (TFT) substrate and a color filter substrate. A liquid crystal layer is formed between the TFT substrate and the color filter substrate. Data lines D and scan lines S are formed on the TFT substrate, and a plurality of pixels are arranged in regions divided by the scan lines S and the data lines D.

A TFT included in each of the pixels transmits a voltage of a data signal supplied via a data line D to a liquid crystal capacitor Clc in response to a scan signal from a scan line S. For this purpose, a gate electrode of the TFT is connected to the scan line S, and a first electrode thereof is connected to the data line D. A second electrode of the TFT is connected to the liquid crystal capacitor Clc and a storage capacitor SC.

Here, the first electrode is one of a source electrode and a drain electrode of the TFT, and the second electrode is an electrode different from the first electrode. For example, when the first electrode is set as the drain electrode, the second electrode is set as the source electrode. In addition, the liquid crystal capacitor Clc represents the liquid crystal material between a pixel electrode (not shown) and a common electrode formed on the TFT substrate. The storage capacitor SC maintains the voltage of the data signal transmitted to the pixel electrode for a period of time until a next data signal is supplied.

A black matrix and a color filter are formed on the color filter substrate.

The common electrode may be formed on the color filter substrate in a vertical electric field driving mode, such as a twisted nematic (TN) mode and a vertical alignment (VA) mode, or on the TFT substrate with the pixel electrode in a horizontal electric field driving mode, such as an in plane switching (IPS) mode and a fringe field switching (FFS) mode. A common voltage Vcom is supplied to the common electrode. The liquid crystal panel may be implemented with any liquid crystal mode and is not limited to the above-described TN mode, VA mode, IPS mode, and FFS mode.

The data driver 120 converts image data RGB input from the timing controller 130 into positive polarity/negative polarity gamma compensation voltages and generates positive polarity/negative polarity analog data voltages. The positive polarity/negative polarity analog data voltages generated by the data driver 120 are supplied to the data lines D as data signals.

Figure 2:
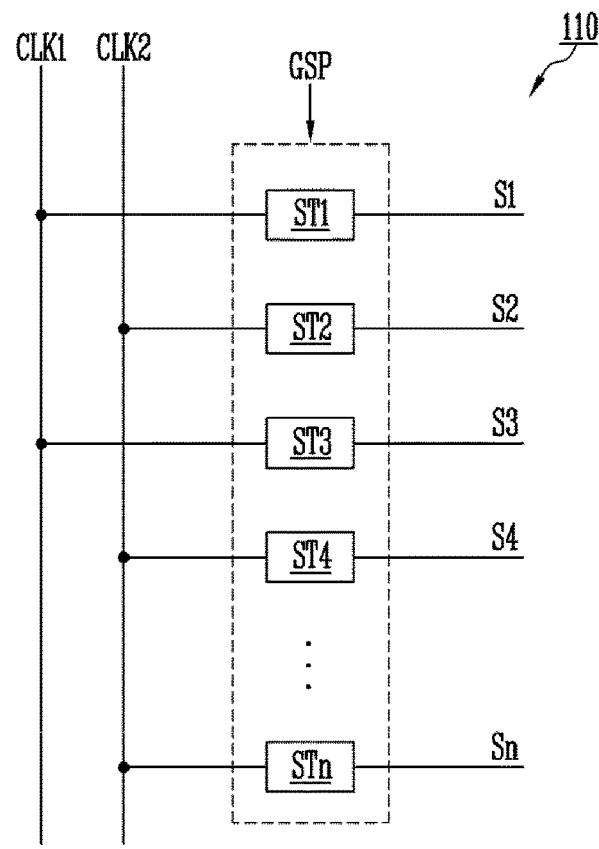
FIG. 2 is a view schematically illustrating the scan driver of FIG. 1.

The scan driver 110 supplies scan signals to the scan lines S. For example, the scan driver 110 may sequentially supply the scan signals to the scan lines S. When the scan signals are sequentially supplied to the scan lines S, the pixels are selected in units of horizontal lines, and the pixels selected by the scan signals receive the data signals. For this purpose, the scan driver 110 includes stages ST1 to STn respectively connected to the scan lines S as illustrated in FIG. 2. The scan driver 110 may be mounted on the liquid crystal panel in the form of an amorphous silicon gate driver (ASG). That is, the scan driver 110 may be mounted on the TFT substrate through a thin film process. In addition, the scan driver 110 may be mounted on both sides of the liquid crystal panel with the pixel unit 100 interposed in between.

The timing controller 130 supplies a gate control signal to the scan driver 110 based on timing signals, such as the image data RGB, a vertical synchronizing signal Vsync, a horizontal synchronizing signal Hsync, a data enable signal DE, and a clock signal CLK, that are output from the host system 140 and supplies a data control signal to the data driver 120.

The gate control signal includes a gate start pulse GSP and at least one gate shift clock GSC. The gate start pulse GSP controls the timing of a first scan signal. The gate shift clock GSC includes at least one clock signal for shifting the gate start pulse GSP.

The data control signal includes a source start pulse SSP, a source sampling clock SSC, a source output enable signal SOE, and a polarity control signal POL. The source start pulse SSP controls a data sampling start point of the data driver 120. The source sampling clock SSC controls a sampling operation of the data driver 120 based on a rising or falling edge. The source output enable signal SOE controls the output timing of the data driver 120. The polarity control signal POL inverts the polarity of a data signal output from the data driver 120 in a j-th (j is a natural number) horizontal period. Here, if the image data RGB to be input to the data driver 120 is transmitted in a mini low voltage differential signaling (LVDS) interface standard, the source start pulse SSP and the source sampling clock SSC may be omitted.

The host system 140 supplies the image data RGB to the timing controller 130 through an interface, such as low voltage differential signaling (LVDS) and transition minimized differential signaling (TMDS). In addition, the host system 140 supplies the timing signals Vsync, Hsync, DE, and CLK to the timing controller 130.

FIG. 2 is a view schematically illustrating the scan driver of FIG. 1.

Referring to FIG. 2, the scan driver 110 according to an embodiment of the present disclosure includes a plurality of stages ST1 to STn. Each of the stages ST1 to STn is connected to one of the scan lines S1 to Sn and supplies a scan signal to one of the scan lines S1 to Sn in response to a gate start pulse GSP. Here, an i-th (i is a natural number) stage STi is connected to an i-th scan line Si and may supply a scan signal to an i-th scan line Si.

Each of the stages ST1 to STn receives one of the clock signals CLK1 and CLK2 supplied by the timing controller 130 as a gate shift clock GSC. For example, odd-numbered stages ST1, ST3, . . . are driven by a first clock signal CLK1 and even-number stages ST2, ST4, . . . may be driven by a second clock signal CLK2.

Figure 3:
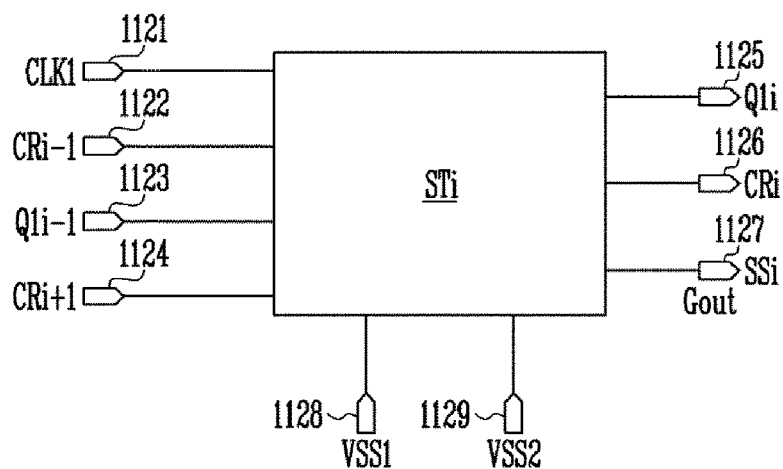
FIG. 3 is a view schematically illustrating terminals connected to a stage.
Figure 5:
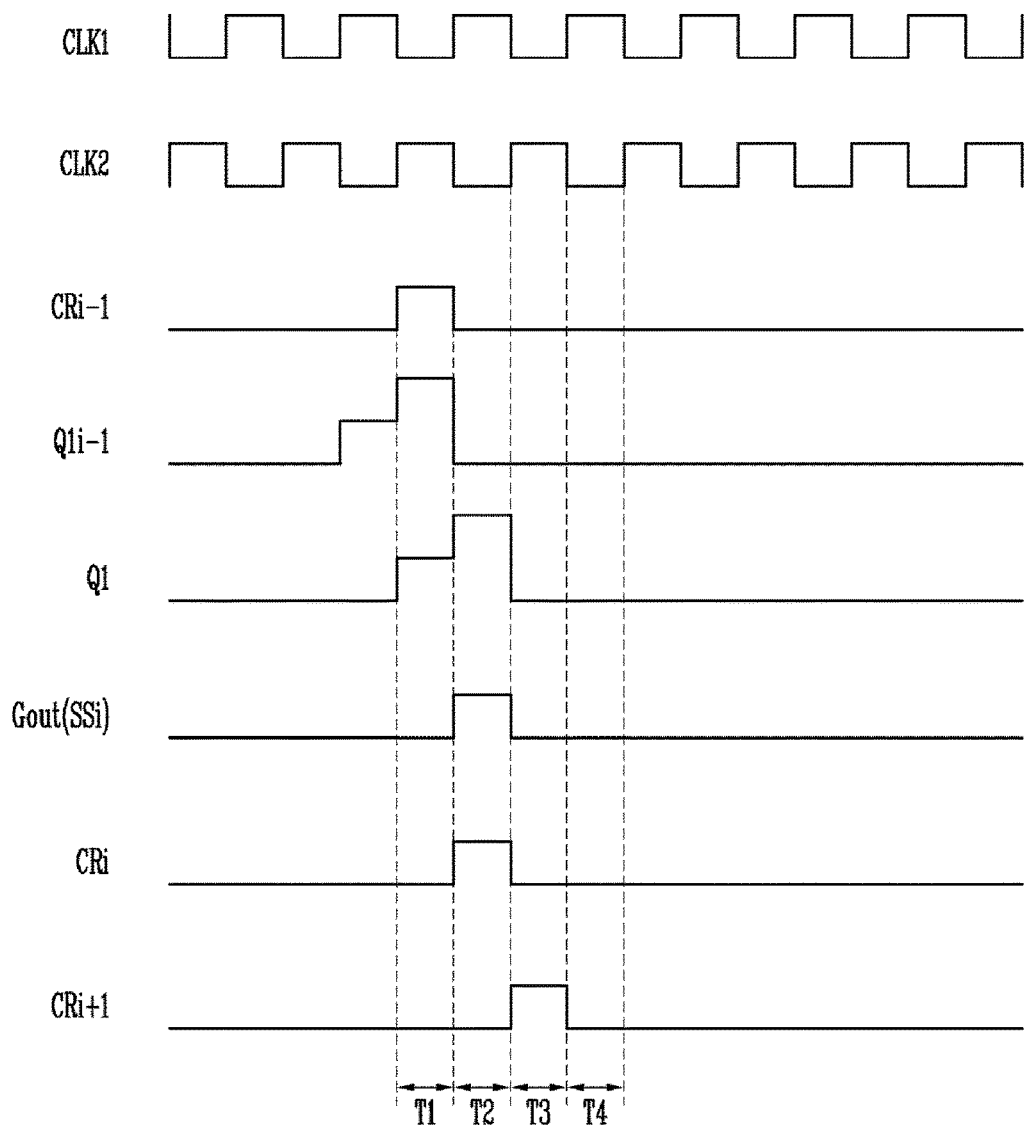
FIG. 5 is a waveform diagram illustrating a method of driving the stage circuit of FIG. 4.

The first clock signal CLK1 is a waveform signal that repeatedly transitions between a high level and a low level as illustrated in FIG. 5. The high level of the first clock signal CLK1 may be set as a gate-on voltage and the low level thereof may be set as a second off voltage VSS2 as illustrated in FIG. 3.

The second clock signal CLK2 is a waveform signal that repeatedly transitions between a high level and a low level as illustrated in FIG. 5. The high level of the second clock signal CLK2 may be set as the gate-on voltage and the low level thereof may be set as the second off voltage VSS2. Here, the second clock signal CLK2 may be set as a signal obtained by inverting the first clock signal CLK1.

Although it is illustrated in FIG. 2 that the two clock signals CLK1 and CLK2 are supplied to the scan driver 110, the present disclosure is not limited thereto. For example, two or more clock signals may be supplied to the scan driver 110 in response to scan signals supplied to the scan lines S1 to Sn.

In addition, in FIG. 2, only the n stages ST1 to STn are illustrated. However, the present disclosure is not limited thereto. For example, the scan driver 110 may additionally include a plurality of dummy stages to generate signals generated by previous stages.

FIG. 3 is a view schematically illustrating terminals connected to a stage. In FIG. 3, for convenience sake, an i-th stage STi is illustrated.

Referring to FIG. 3, the i-th stage STi includes a first input terminal 1121, a second input terminal 1122, a third input terminal 1123, a fourth input terminal 1124, a first output terminal 1125, a second output terminal 1126, a third output terminal (Gout) 1127, a first power source input terminal 1128, and a second power source input terminal 1129.

The first input terminal 1121 receives the first clock signal CLK1.

The second input terminal 1122 receives an (i−1)-th carry signal CRi−1 from a previous stage STi−1.

The third input terminal 1123 receives a voltage of a first node Q1i−1 of a previous stage STi−1. Here, the voltage of the first node Q1i−1 of the previous stage STi−1 is set to be higher than a voltage of the (i−1)-th carry signal CRi−1. That is, the first node Q1i−1 of the previous stage STi−1 is set to have the voltage higher than that of the (i−1)-th carry signal CRi−1 when the (i−1)-th carry signal CRi−1 is supplied.

The fourth input terminal 1124 receives an (i+1)-th carry signal CRi+1 from a next stage STi+1.

The first output terminal 1125 supplies the voltage of the first node Q1i of the i-th stage STi to the next stage STi+1.

The second output terminal 1126 supplies a carry voltage CRi of the i-th stage STi to the next stage STi+1.

The third output terminal 1127 supplies a scan signal SSi of the i-th stage STi to the i-th scan line Si.

The first power source input terminal 1128 receives a first off voltage VSS1, and the second power source input terminal 1129 receives a second off voltage VSS2. Here, the second off voltage VSS2 may be set to be lower than the first off voltage VSS1. For example, the second off voltage VSS2 may be set as −14V, and the first off voltage VSS1 may be set as −11V. In addition, according to exemplary embodiments of the present disclosure, the first off voltage VSS1 and the second off voltage VSS2 are used to completely turn off a transistor. However, the present disclosure is not limited thereto. For example, the first off voltage VSS1 may be supplied to the first power source input terminal 1128 and the second power source input terminal 1129.

Figure 4:
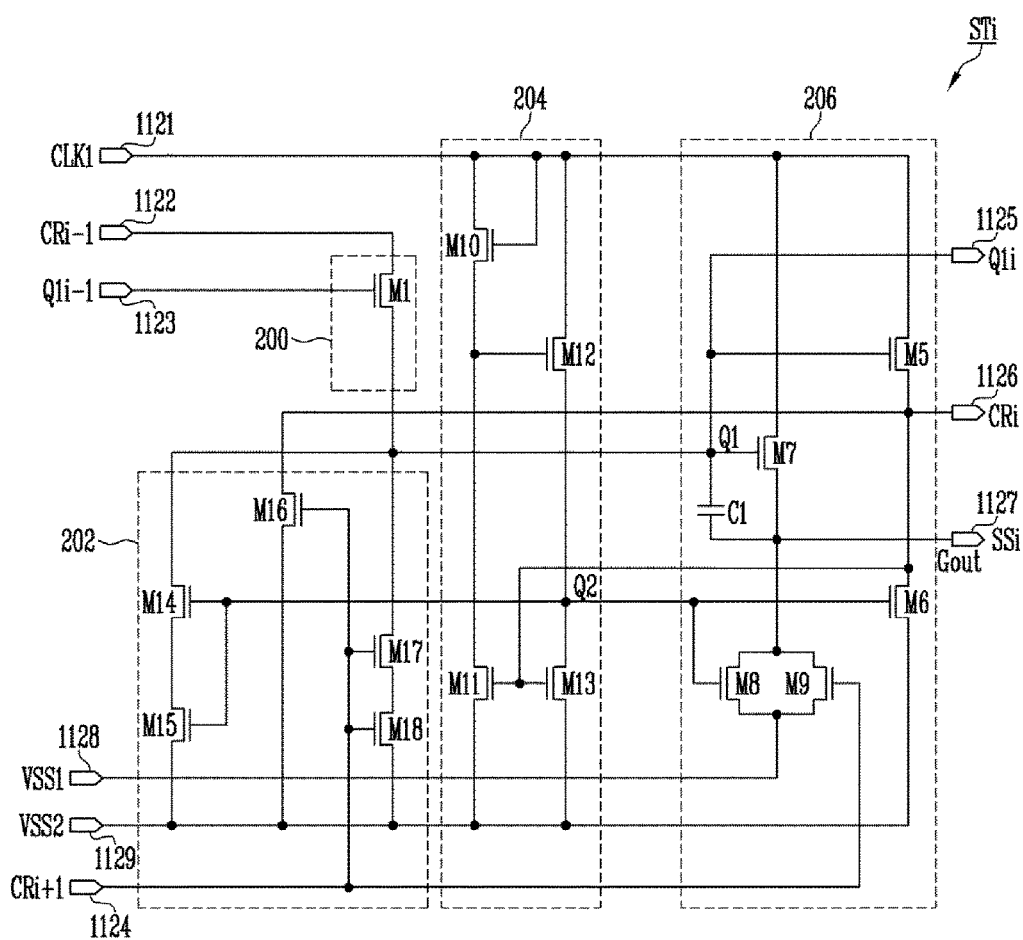
FIG. 4 is a circuit diagram of the stage of FIG. 3 according to a first embodiment.

FIG. 4 is a circuit diagram of the stage of FIG. 3 according to a first embodiment.

Referring to FIG. 4, the stage STi according to the first embodiment of the present disclosure includes a pull-up unit 200, a pull-down unit 202, a controller 204, and an output unit 206.

The pull-up unit 200 controls a voltage of a first node Q1 in response to the (i−1)-th carry signal CRi−1 and the voltage of the first node Q1i−1 of the previous stage. For this purpose, the pull-up unit 200 includes a first transistor M1.

A first electrode of the first transistor M1 is connected to the second input terminal 1122, a second electrode thereof is connected to the first node Q1, and a gate electrode thereof is connected to the third input terminal 1123. The first transistor M1 electrically connects the second input terminal 1122 and the first node Q1 in response to the voltage of the first node Q1i−1 of the previous stage.

In addition, the voltage of the first node Q1i−1 of the previous stage supplied to the gate electrode of the first transistor M1 is set to be higher than that of the (i−1)-th carry signal CRi−1. Therefore, it is possible to minimize a width of the first transistor M1 and to minimize a mounting area of the scan driver 110.

Figure 6A:
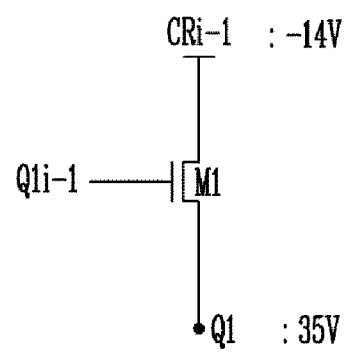
FIGS. 6A and 6B are views illustrating embodiments of a voltage between a first electrode and a second electrode of a first transistor.
Figure 6B:
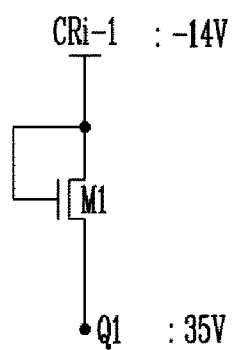

Specifically, the first transistor M1 is for increasing the voltage of the first node Q1. To illustrate, when the first transistor M1 is diode connected, such as shown in FIG. 6B, the first transistor M1 has a large mounting area so that a sufficiently high voltage of the first node Q1 can be achieved. On the other hand, when the voltage of the first node Q1i−1 of the previous stage is supplied to the gate electrode of the first transistor M1, such as described with respect to an embodiment of the present disclosure and shown in FIG. 6B, a turn-on characteristic of the first transistor M1 is improved so that the mounting area of the first transistor M1 is minimized. For example, in comparison with the case of FIG. 6B in which the (i−1)-th carry signal CRi−1 is supplied to the gate electrode and the first electrode of the first transistor M1, the mounting area of the first transistor M1 according to the exemplary embodiment of FIG. 4 may be reduced by nearly half.

The output unit 206 outputs the voltage of the first node Q1 to the first output terminal 1125, outputs the carry signal CRi to the second output terminal 1126, and outputs the scan signal SSi to the third output terminal 1127 in response to the first clock signal CLK1 supplied to the first input terminal 1121 and in response to the voltage of the first node Q1 and a voltage of a second node Q2. For this purpose, the output unit 206 includes fifth to ninth transistors M5 to M9 and a first capacitor C1.

A first electrode of the fifth transistor M5 is connected to the first input terminal 1121, a second electrode thereof is connected to the second output terminal 1126, and a gate electrode thereof is connected to the first node Q1. The fifth transistor M5 is turned on and off in response to the voltage of the first node Q1 and controls the connection between the first input terminal 1121 and the second output terminal 1126.

A first electrode of a sixth transistor M6 is connected to the second output terminal 1126, a second electrode thereof is connected to the second power source input terminal 1129, and a gate electrode thereof is connected to the second node Q2. The sixth transistor M6 is turned on and off in response to the voltage of the second node Q2 and controls the connection between the second output terminal 1126 and the second power source input terminal 1129.

A first electrode of a seventh transistor M7 is connected to the first input terminal 1121, a second electrode thereof is connected to the third output terminal 1127, and a gate electrode thereof is connected to the first node Q1. The seventh transistor M7 is turned on and off in response to the voltage of the first node Q1 and controls the connection between the first input terminal 1121 and the third output terminal 1127.

A first electrode of an eighth transistor M8 is connected to the third output terminal 1127, a second electrode thereof is connected to the first power source input terminal 1128, and a gate electrode thereof is connected to the second node Q2. The eighth transistor M8 is turned on and off in response to the voltage of the second node Q2 and controls the connection between the third output terminal 1127 and the first power source input terminal 1128.

A first electrode of a ninth transistor M9 is connected to the third output terminal 1127, a second electrode thereof is connected to the first power source input terminal 1128, and a gate electrode thereof is connected to the fourth input terminal 1124. The ninth transistor M9 is turned on when the (i+1)-th carry signal CRi+1 is supplied and electrically connects the third output terminal 1127 and the first power source input terminal 1128.

The first capacitor C1 is connected between the first node Q1 and the third output terminal 1127. The first capacitor C1 functions as a boosting capacitor. That is, the first capacitor C1 increases the voltage of the first node Q1 in response to the increase in a voltage of the third output terminal 1127 when the seventh transistor M7 is turned on so that the seventh transistor M7 may stably maintain a turn-on state.

The controller 204 controls the voltage of the second node Q2 in response to the first clock signal CLK1 supplied to the first input terminal 1121. For this purpose, the controller 204 includes tenth to $13^{th}$ transistors M10 to M13.

A first electrode and a gate electrode of the tenth transistor M10 are connected to the first input terminal 1121, and a second electrode thereof is connected to a first electrode of the 11$^{th}$ transistor M11 and a gate electrode of the 12$^{th}$ transistor M12. The tenth transistor M10 is diode connected and is turned on when the first clock signal CLK1 is supplied to the first input terminal 1121.

A first electrode of the 11$^{th}$ transistor M11 is connected to the second electrode of the tenth transistor M10, a second electrode thereof is connected to the second power source input terminal 1129, and a gate electrode thereof is connected to the second output terminal 1126. The 11$^{th}$ transistor M11 is turned on when the carry signal CRi is supplied to the second output terminal 1126.

A first electrode of the 12$^{th}$ transistor M12 is connected to the first input terminal 1121, a second electrode thereof is connected to the second node Q2, and a gate electrode thereof is connected to the second electrode of the tenth transistor M10. The 12$^{th}$ transistor M12 is turned on and off in response to a voltage supplied by the tenth transistor M10 and controls the connection between the first input terminal 1121 and the second node Q2.

A first electrode of the 13$^{th}$ transistor M13 is connected to the second node Q2, a second electrode thereof is connected to the second power source input terminal 1129, and a gate electrode thereof is connected to the second output terminal 1126. The 13$^{th}$ transistor M13 is turned on when the carry signal CRi is supplied to the second output terminal 1126.

The pull-down unit 202 controls the voltage of the first node Q1 and a voltage of the second output terminal 1126 in response to the voltage of the second node Q2 and the (i+1)-th carry signal CRi+1 supplied to the fourth input terminal 1124. For this purpose, the pull-down unit 202 includes 14$^{th}$ to 18$^{th}$ transistors M14 to M18.

The 14$^{th}$ transistor M14 and the 15$^{th}$ transistor M15 are serially connected between the first node Q1 and the second power source input terminal 1129. Gate electrodes of the 14$^{th}$ transistor M14 and the 15$^{th}$ transistor M15 are connected to the second node Q2. The 14$^{th}$ transistor M14 and the 15$^{th}$ transistor M15 are turned on and off in response to the voltage of the second node Q2 and control the electrical connection between the first node Q1 and the second power source input terminal 1129. In addition, since the transistors M14 and M15 are serially connected between the first node Q1 and the second power source input terminal 1129, a voltage between the first node Q1 and the second power source input terminal 1129 is divided so that it is possible to improve reliability.

The 17$^{th}$ transistor M17 and the 18$^{th}$ transistor M18 are serially connected between the first node Q1 and the second power source input terminal 1129. Gate electrodes of the 17$^{th}$ transistor M17 and the 18$^{th}$ transistor M18 are connected to the fourth input terminal 1124. The 17$^{th}$ transistor M17 and the 18$^{th}$ transistor M18 are turned on when the (i+1)-th carry signal CRi+1 is supplied and electrically connects the first node Q1 and the second power source input terminal 1129. In addition, since the transistors M17 and M18 are serially connected between the first node Q1 and the second power source input terminal 1129, the voltage between the first node Q1 and the second power source input terminal 1129 is divided so that it is possible to improve a reliability.

A first electrode of the 16$^{th}$ transistor M16 is connected to the second output terminal 1126, a second electrode thereof is connected to the second power source input terminal 1129, and a gate electrode thereof is connected to the fourth input terminal 1124. The 16$^{th}$ transistor M16 is turned on when the (i+1)-th carry signal CRi+1 is supplied and electrically connects the second output terminal 1126 and the second power source input terminal 1129.

FIG. 5 is a waveform diagram illustrating a method of driving the stage circuit of FIG. 4. Hereinafter, when a clock signal and a carry signal are supplied, it means a gate on voltage, and when the clock signal and the carry signal are stopped from being supplied, it means a gate off voltage.

Referring to FIG. 5, first, in a first period T1, the (i−1)-th carry signal CRi−1 is supplied to the second input terminal 1122, and the voltage of the first node Q1i−1 of the (i−1)-th stage STi−1 is supplied to the third input terminal 1123. Here, the voltage of the first node Q1i−1 of the (i−1)-th stage STi−1 is set to be higher than that of the (i−1)-th carry signal CRi−1. Therefore, the first transistor M1 is turned on. When the first transistor M1 is turned on, the (i−1)-th carry signal CRi−1 is supplied to the first node Q1.

When the (i−1)-th carry signal CRi−1 is supplied to the first node Q1, the fifth transistor M5 and the seventh transistor M7 are turned on. When the fifth transistor M5 and the seventh transistor M7 are turned on, the second output terminal 1126 and the third output terminal 1127 are electrically connected to the first input terminal 1121.

In a second period T2, the first clock signal CLK1 is supplied to the first input terminal 1121. At this time, since the fifth transistor M5 and the seventh transistor M7 are set to be in a turn-on state, the first clock signal CLK1 supplied to the first input terminal 1121 is supplied to the second output terminal 1126 and the third output terminal 1127. Here, the first clock signal CLK1 supplied to the second output terminal 1126 is supplied to a previous stage and a next stage as the i-th carry signal CRi. The first clock signal CLK1 supplied to the third output terminal 1127 is supplied to the scan line Si as the scan signal SSi.

In the second period T2, the voltage of the first node Q1 is increased to a voltage higher than the first clock signal CLK1 by boosting of the first capacitor C1 so that the fifth transistor M5 and the seventh transistor M7 stably maintain the turn-on state. The voltage of the first node Q1 is supplied to the next stage STi+1 by the first output terminal 1125 (that is, Q1i).

In addition, when the first clock signal CLK1 is supplied to the second output terminal 1126, the 11$^{th}$ transistor M11 and the 13$^{th}$ transistor M13 are turned on. When the 11$^{th}$ transistor M11 is turned on, the second off voltage VSS2 is supplied to the gate electrode of the 12$^{th}$ transistor M12. When the 13$^{th}$ transistor M13 is turned on, the second off voltage VSS2 is supplied to the second node Q2. Therefore, in the second period T2, the second node Q2 is set to have the second off voltage VSS2 so that the sixth transistor M6 maintains a turn-off state.

When the first clock signal CLK1 is supplied to the first input terminal 1121, the tenth transistor M10 is turned on. Here, the tenth transistor M10 is diode connected. Therefore, when the tenth transistor M10 and the 11$^{th}$ transistor M11 have similar channel widths, a voltage of the gate electrode of the 12$^{th}$ transistor M12 is reduced to the second off voltage VSS2. In addition, although the 12$^{th}$ transistor M12 is turned on, the second node Q2 may stably maintain the second off voltage VSS2 due to the 13$^{th}$ transistor M13.

In a third period T3, the (i+1)-th carry signal CRi+1 is supplied to the fourth input terminal 1124. When the (i+1)-th carry signal CRi+1 is supplied to the fourth input terminal 1124, the ninth transistor M9, the 16$^{th}$ transistor M16, the 17$^{th}$ transistor M17, and the 18$^{th}$ transistor M18 are turned on.

When the ninth transistor M9 is turned on, the first off voltage VSS1 is supplied from the first power source input terminal 1128 to the third output terminal 1127. When the 16th transistor M16 is turned on, the second off voltage VSS2 is supplied from the second power source input terminal 1129 to the second output terminal 1126.

When the 17th transistor M17 and the 18th transistor M18 are turned on, the second off voltage VSS2 is supplied to the first node Q1. When the second off voltage VSS2 is supplied to the first node Q1, the fifth transistor M5 and the seventh transistor M7 are turned off. At this time, the second off voltage VSS2 is supplied to the gate electrode of the seventh transistor M7, and the first off voltage VSS1 higher than the second off voltage VSS2 is supplied to the second electrode of the seventh transistor M7. Therefore, in the third period T3, the seventh transistor M7 may be set to be in the turn-off state completely.

In a fourth period T4, the first clock signal CLK1 is supplied to the first input terminal 1121. When the first clock signal CLK1 is supplied to the first input terminal 1121, the tenth transistor M10 and the 12th transistor M12 are turned on. When the 12th transistor M12 is turned on, a voltage of the first clock signal CLK1 is supplied to the second node Q2.

When the voltage of the first clock signal CLK1 is supplied to the second node Q2, the sixth transistor M6, the eighth transistor M8, the 14th transistor M14, and the 15th transistor M15 are turned on.

When the sixth transistor M6 is turned on, the second off voltage VSS2 is supplied to the second output terminal 1126. When the eighth transistor M8 is turned on, the first off voltage VSS1 is supplied to the third output terminal 1127. When the 14th transistor M14 and the 15th transistor M15 are turned on, the second off voltage VSS2 is supplied to the first node Q1. When the second off voltage VSS2 is supplied to the first node Q1, the fifth transistor M5 and the seventh transistor M7 are set to be in the turn-off state.

Each of the stages according to exemplary embodiments of the present disclosure outputs a scan signal SS and a carry signal CR in response to the above-described first to fourth periods T1 to T4.

In addition, according to exemplary embodiments of the present disclosure, the voltage of the first node Q1i−1 of the previous stage STi−1 is supplied to the gate electrode of the first transistor M1, which controls the voltage of the first node Q1. Therefore, in the first period T1, when the voltage of the (i−1)-th carry signal CRi−1 of about 12V is supplied to the second input terminal 1122, the voltage of about 35V is supplied to the third input terminal 1123. When a high voltage is supplied to the gate electrode of the first transistor M1, it is possible to minimize a channel width of the first transistor M1 and the mounting area of the scan driver 110.

In the second period T2 in which the voltage of the first node Q1 increases to the voltage of 35V, the second input terminal 1122 is set to have the second off voltage VSS2. In this case, as illustrated in FIG. 6A, a voltage difference between the first electrode and the second electrode of the first transistor M1 is set as about 49V, and as a result, the first transistor M1 rapidly deteriorates. When the first transistor M1 deteriorates, its ability to conduct current is reduced so that the voltage of the first node Q1 is not charged as desired, and reliability of its operation deteriorates.

As illustrated in FIG. 6B, although the gate electrode of the first transistor M1 is connected to the second input terminal 1122, the voltage difference between the first electrode and the second electrode of the first transistor M1 is also set as about 49V. As such, the first transistor M1 in this case also rapidly deteriorates.

Figure 7:
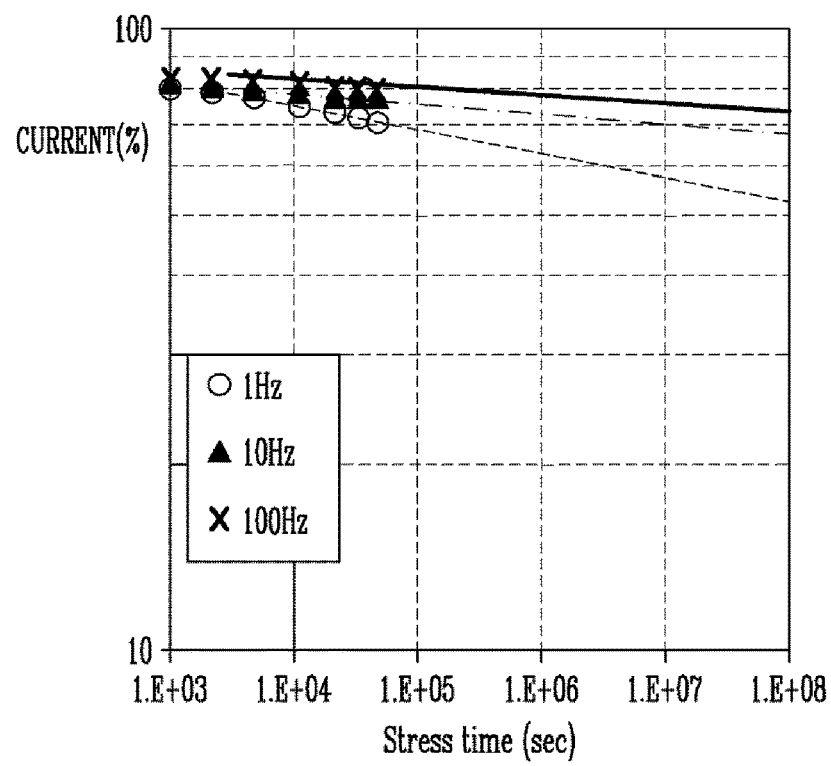
FIG. 7 is a graph illustrating a current reduction amount corresponding to deterioration of a first transistor.

FIG. 7 is a graph illustrating a current reduction amount corresponding to deterioration of a first transistor. In FIG. 7, 1 Hz, 10 Hz, and 100 Hz mean frequencies of the first clock signal CLK1.

Referring to FIG. 7, with the lapse of time, the first transistor M1 deteriorates such that its current conducting capacity is reduced over time. As the amount of the current of the first transistor M1 is reduced with the lapse of time, so is the voltage of the first node Q1, which means that a probability of generating an erroneous operation increases.

Figure 8:
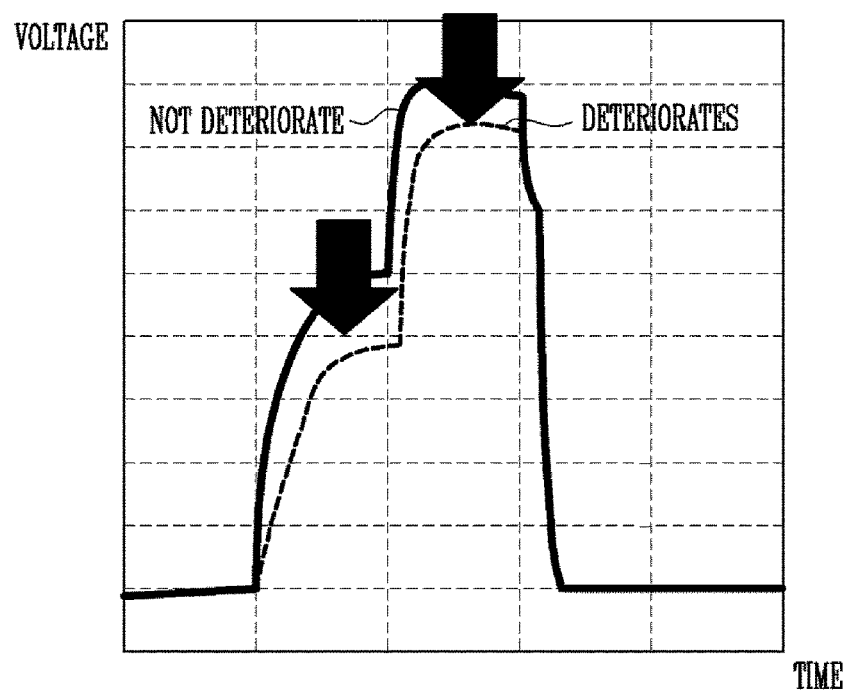
FIG. 8 is a view illustrating a voltage of a first node corresponding to deterioration of a first transistor.

FIG. 8 is a view illustrating a voltage of a first node corresponding to deterioration of a first transistor.

Referring to FIG. 8, when the first transistor M1 does not deteriorate, the voltage of the first node Q1 stably increases to a desired voltage. However, when the first transistor M1 deteriorates, the amount of flowing current is reduced so that the voltage of the first node Q1 does not increase to the desired voltage.

Figure 9:
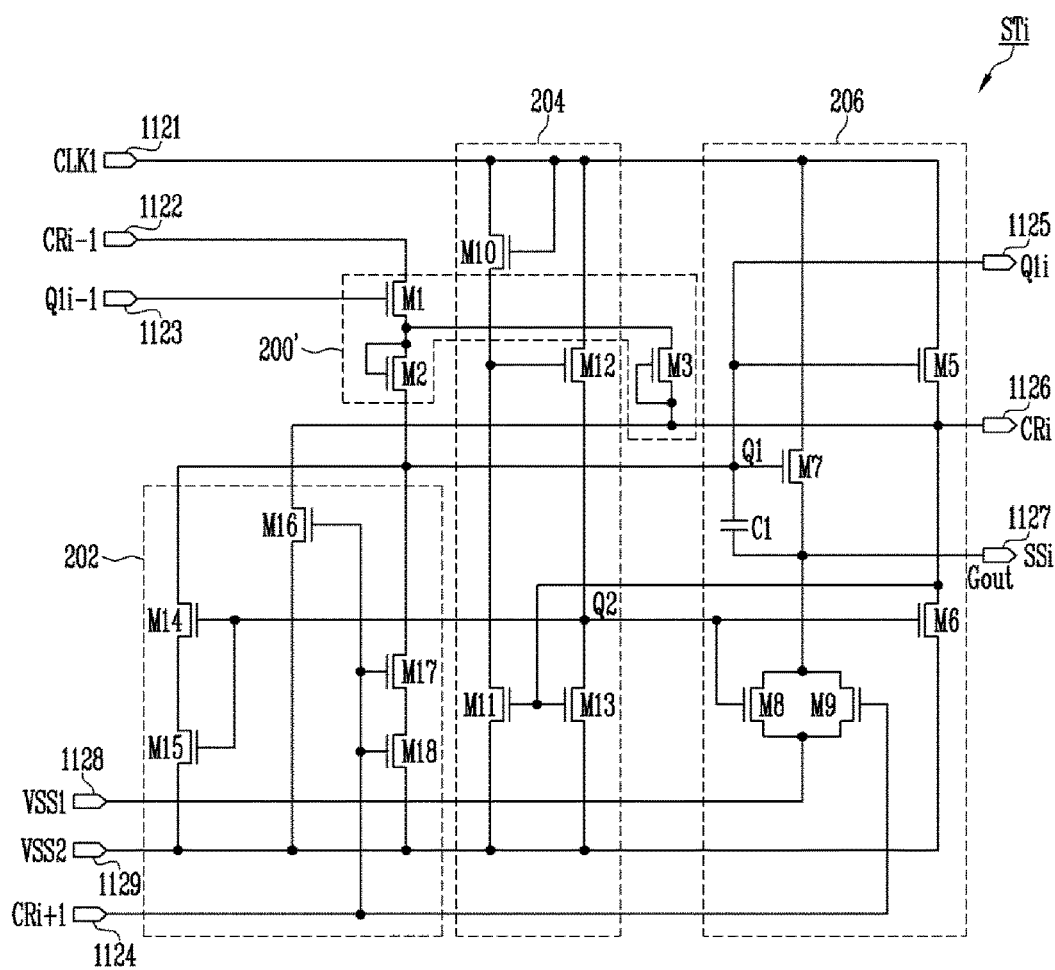
FIG. 9 is a circuit diagram of the stage of FIG. 3 according to a second embodiment.

FIG. 9 is a circuit diagram of the stage of FIG. 3 according to a second embodiment. In describing FIG. 9, the same elements as those of FIG. 4 are denoted by the same reference numerals, and a detailed description thereof is not provided.

Referring to FIG. 9, the stage STi according to the second embodiment of the present disclosure includes a pull-up unit 200', a pull-down unit 202, a controller 204, and an output unit 206.

The pull-up unit 200' controls the voltage of the first node Q1 in response to the (i−1)-th carry signal CRi−1 and the voltage of the first node Q1i−1 of the previous stage. For this purpose, the pull-up unit 200' includes a first transistor M1, a second transistor M2, and a third transistor M3.

A first electrode of the first transistor M1 is connected to the second input terminal 1122, a second electrode thereof is connected to the first node Q1 via the second transistor M2, and a gate electrode thereof is connected to the third input terminal 1123. The first transistor M1 controls the electrical connection between the second input terminal 1122 and the first node Q1 in response to the voltage of the first node Q1i−1 of the previous stage.

A first electrode and a gate electrode of the second transistor M2 are connected to the second electrode of the first transistor M1, and a second electrode thereof is connected to the first node Q1. The second transistor M2 is diode connected so that current may flow from the second electrode of the first transistor M1 to the first node Q1.

A first electrode of the third transistor M3 is connected to the second electrode of the first transistor M1, and a second electrode and a gate electrode thereof are connected to the second output terminal 1126. The third transistor M3 is diode connected so that current may flow from the second output terminal 1126 to the second electrode of the first transistor M1.

In addition, the second transistor M2 and the third transistor M3 for controlling the flow of the current, which are added in FIG. 9, may have minimized channel widths (that is, minimized mounting areas).

A method of driving the stage STi including the pull-up unit 200' is the same as a method of driving the stage of FIG. 4. Therefore, a detailed description thereof is not provided. The following description mainly discusses the voltage applied to the first transistor M1.

Figure 10A:
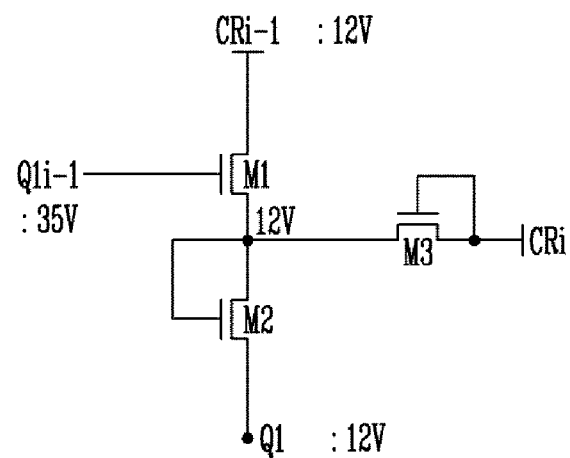
FIGS. 10A and 10B are views illustrating a voltage applied to the pull-up unit of FIG. 9.
Figure 10A:
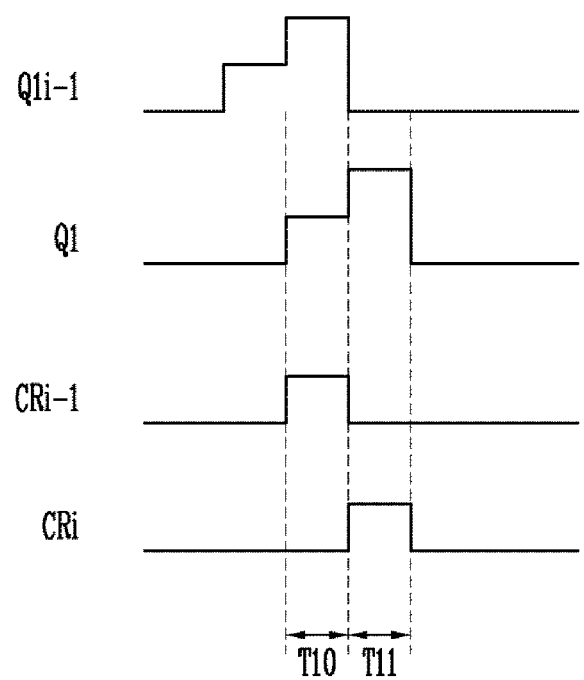
Figure 10B:
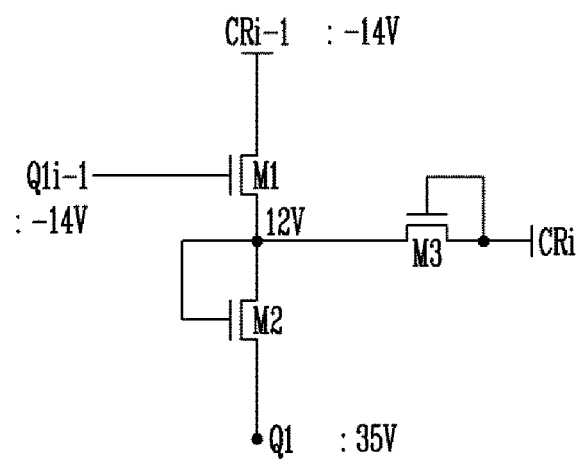
Figure 10B:
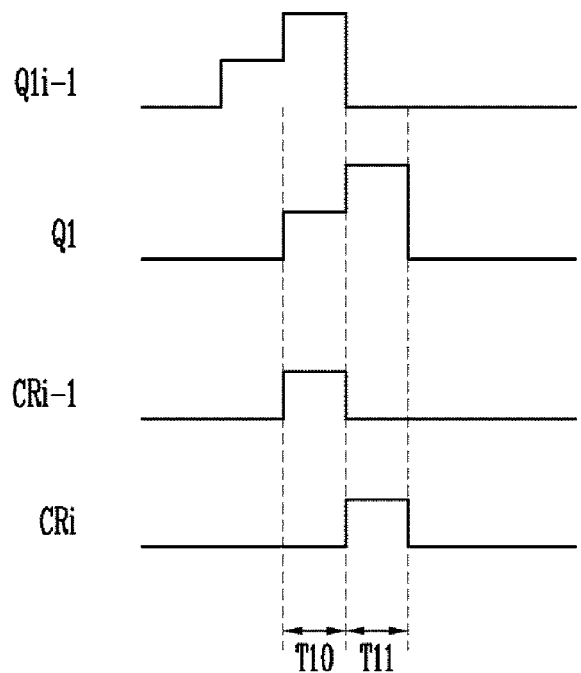

FIGS. 10A and 10B are views illustrating a voltage applied to the pull-up unit of FIG. 9.

Referring to FIGS. 10A and 10B, in a tenth period T10, the (i−1)-th carry signal Cri−1 is supplied to the second input terminal 1122, and the voltage of the first node Q1i−1 of the previous stage STi-1 is supplied to the third input terminal 1123. When the voltage of the first node Q1i-1 of the previous stage STi-1 is supplied to the third input terminal 1123, the first transistor M1 is turned on. When the first transistor M1 is turned on, the voltage (for example, 12V) of the (i-1)-th carry signal CRi-1 is supplied to the first node Q1.

In the tenth period T10, the first electrode and the second electrode of the first transistor M1 are set to have almost the same voltage. The first electrode and the second electrode of the diode connected second transistor M2 are set to have almost the same voltage.

In an $11^{th}$ period T11, the voltage of the first node Q1 increases to about 35V. At this time, the voltage of the carry signal CRi is supplied from the second output terminal 1126 to the second electrode of the first transistor M1 via the third transistor M3.

Therefore, in the $11^{th}$ period T11, the first electrode and the second electrode of the first transistor M1 are set to have a voltage difference of about 26V. In the $11^{th}$ period T11, the first electrode and the second electrode of the second transistor M2 are set to have a voltage difference of about 23V.

That is, according to exemplary embodiments of the present disclosure, in a period in which the first node Q1 increases to the highest voltage, the voltage difference between the first electrode and the second electrode of each of the first transistor M1 and the second transistor M2 is set to be less than 30V. Therefore, according to exemplary embodiments of the present disclosure, it is possible to minimize deteriorations of the first transistor M1 and the second transistor M2 and to secure their reliability.

Figure 11:
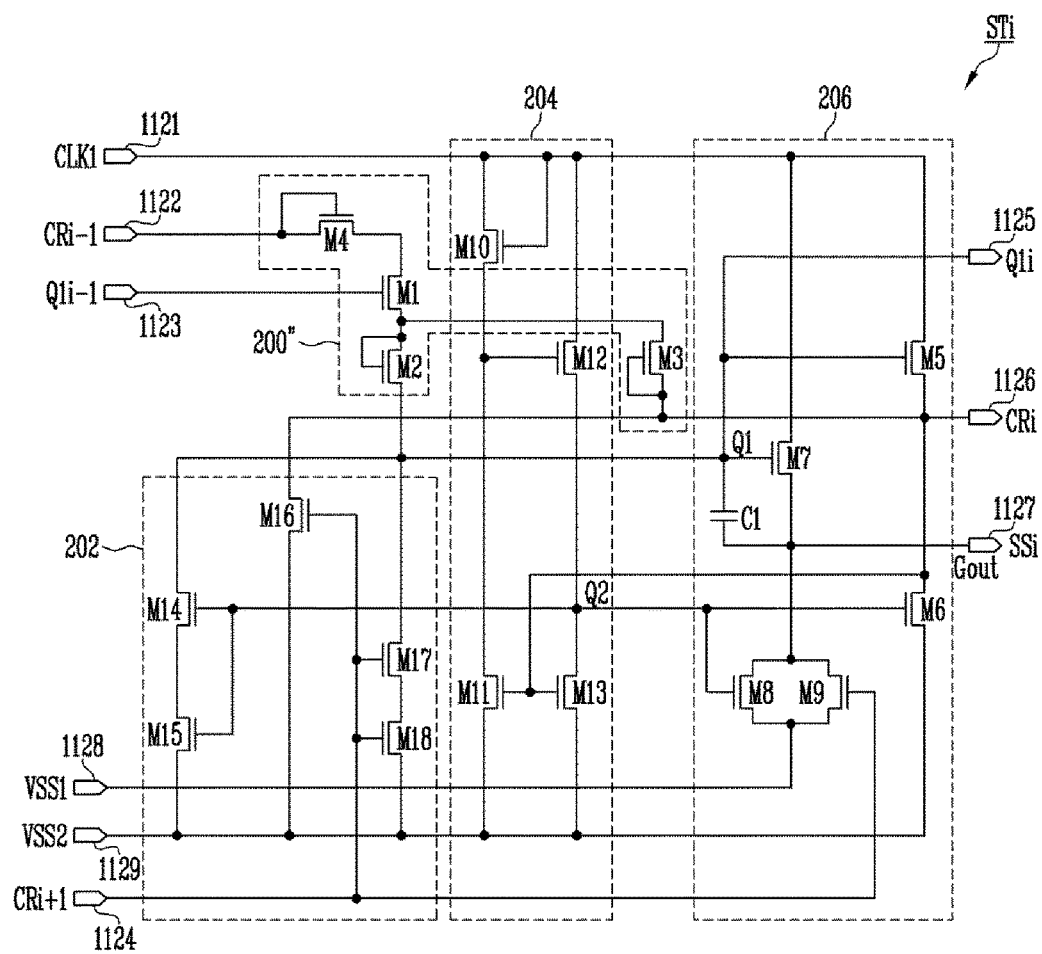
FIG. 11 is a circuit diagram of the stage of FIG. 3 according to a third embodiment.

FIG. 11 is a circuit diagram of the stage of FIG. 3 according to a third embodiment. In describing FIG. 11, the same elements as those of FIG. 9 are denoted by the same reference numerals, and a detailed description thereof is not provided.

Referring to FIG. 11, the stage STi according to the third embodiment of the present disclosure includes a pull-up unit 200'', a pull-down unit 202, a controller 204, and an output unit 206.

The pull-up unit 200'' controls the voltage of the first node Q1 in response to the (i-1)-th carry signal CRi-1 and the voltage of the first node Q1i-1 of the previous stage. For this purpose, the pull-up unit 200'' includes a first transistor M1, a second transistor M2, a third transistor M3, and a fourth transistor M4.

A first electrode and a gate electrode of the fourth transistor M4 are connected to the second input terminal 1122, and a second electrode thereof is connected to the first electrode of the first transistor M1. That is, the fourth transistor M4 is diode connected so that current may flow from the second input terminal 1122 to the first electrode of the first transistor M1. The fourth transistor M4 prevents leakage current from flowing from the first electrode of the first transistor M1 to the second input terminal 1122. In addition, the fourth transistor M4 for preventing generation of the leakage current may have a small channel width (that is, a minimized mounting area).

Figure 12:
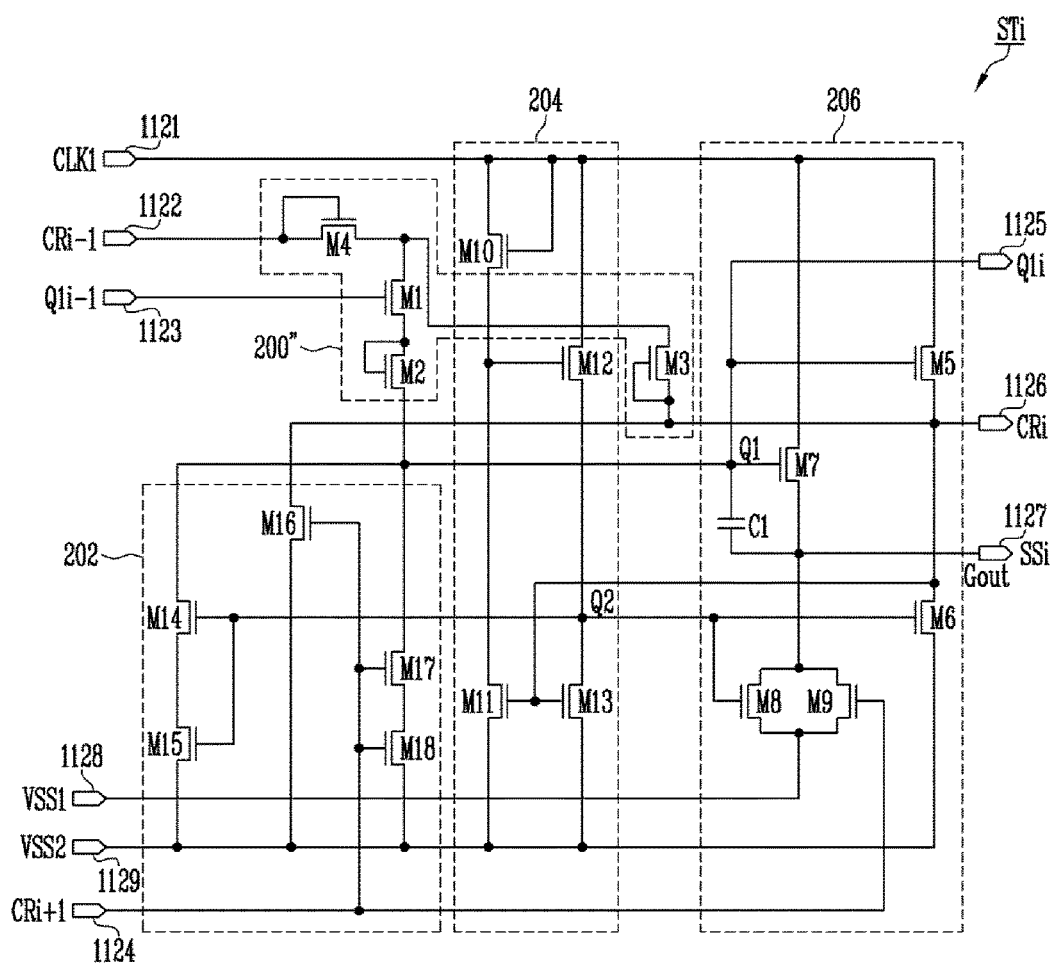
FIG. 12 is a circuit diagram of the stage of FIG. 3 according to a fourth embodiment.
Figure 13:
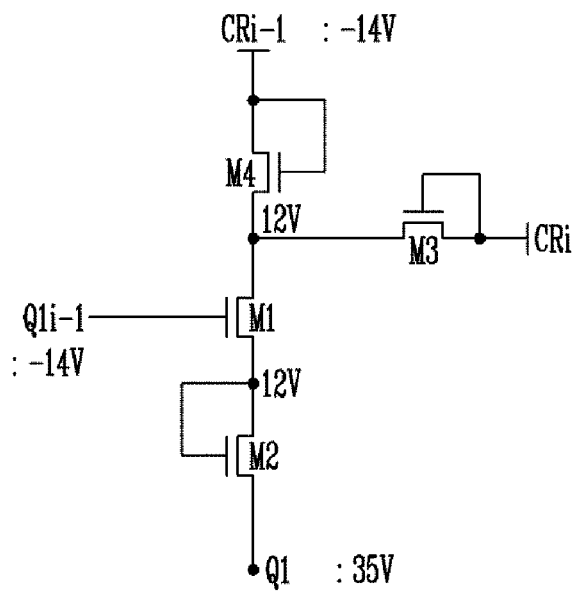
FIG. 13 is a view illustrating a voltage applied to the pull-up unit of FIG. 12.
Figure 13:
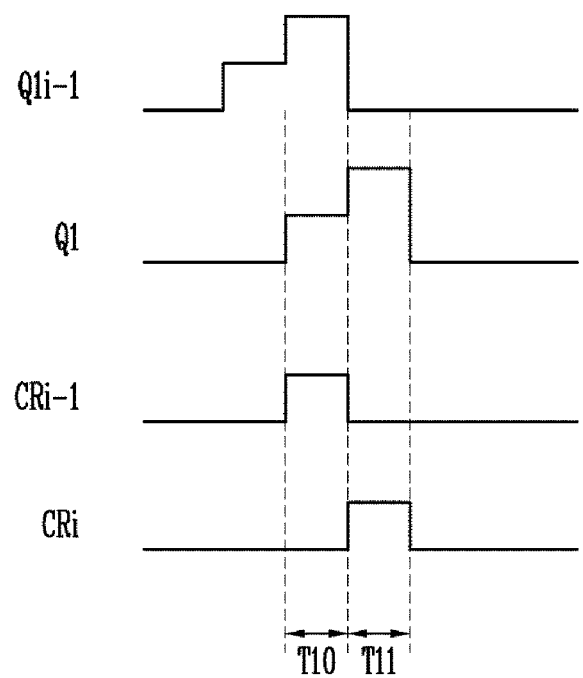

According to other exemplary embodiments of the present disclosure, as illustrated in FIG. 12, the first electrode of the third transistor M3 may be connected to the first electrode of the first transistor M1. Then, as illustrated in FIG. 13, in the $11^{th}$ period T11, a voltage difference between the first electrode and the second electrode of each of the fourth transistor M4, the first transistor M1, and the second transistor M2 is minimized (a voltage of the second electrode of the first transistor M1 may be maintained as about 12V in response to a voltage supplied in a previous period). Therefore, according to exemplary embodiments of the present disclosure, deteriorations of the first transistor M1, the second transistor M2, and the fourth transistor M4 for increasing the voltage of the first node Q1 are minimized so that reliability may be secured.

Example embodiments have been disclosed herein, and although specific terms are employed, they are used and are to be interpreted in a generic and descriptive sense only and not for purposes of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it is understood by those of ordinary skill in the art that various changes in form and details may be made without departing from the spirit and scope of the present disclosure as set forth in the following claims.

What is claimed is:

1. A stage circuit comprising:
an output unit configured to supply a voltage of a first node to a first output terminal, to supply an i-th (i is a natural number) carry signal to a second output terminal, and to supply an i-th scan signal to a third output terminal in response to the voltage of the first node, a voltage of a second node, and a first clock signal supplied to a first input terminal;
a controller configured to control the voltage of the second node in response to the first clock signal supplied to the first input terminal;
a pull-up unit configured to control the voltage of the first node in response to a carry signal of a previous stage supplied to a second input terminal and a voltage of a first node of the previous stage supplied to a third input terminal; and
a pull-down unit configured to control the voltage of the first node in response to the voltage of the second node and a carry signal of a next stage supplied to a fourth input terminal,
wherein the pull-up unit comprises:
a first transistor having a first electrode connected to the second input terminal and a gate electrode connected to the third input terminal;
a second transistor having a first electrode and a gate electrode connected to a second electrode of the first transistor and a second electrode connected to the first node; and
a third transistor having a first electrode connected to the second electrode of the first transistor and a gate electrode and a second electrode connected to the second output terminal.

2. The stage circuit of claim 1, wherein, when the carry signal of the previous stage is supplied, the second input terminal is set to have a lower voltage than that of the third input terminal.

3. The stage circuit of claim 1, wherein the pull-up unit further comprises a fourth transistor having a first electrode and a gate electrode connected to the second input terminal and a second electrode connected to the first electrode of the first transistor.

4. The stage circuit of claim 1, further comprising:
a first power source input terminal configured to receive a first off voltage; and a second power source input terminal configured to receive a second off voltage different from the first off voltage.

5. The stage circuit of claim 4, wherein the second off voltage is set to be lower than the first off voltage.

6. The stage circuit of claim 4, wherein the output unit comprises:
a fifth transistor connected between the first input terminal and the second output terminal and having a gate electrode connected to the first node;
a sixth transistor connected between the second output terminal and the second power source input terminal and having a gate electrode connected to the second node;
a seventh transistor connected between the first input terminal and the third output terminal and having a gate electrode connected to the first node;
an eighth transistor connected between the third output terminal and the first power source input terminal and having a gate electrode connected to the second node; and
a ninth transistor connected between the third output terminal and the first power source input terminal and having a gate electrode connected to the fourth input terminal.

7. The stage circuit of claim 4, wherein the controller comprises:
a tenth transistor having a first electrode and a gate electrode connected to the first input terminal;
an $11^{th}$ transistor connected between a second electrode of the tenth transistor and the second power source input terminal and having a gate electrode connected to the second output terminal;
a $12^{th}$ transistor connected between the first input terminal and the second node and having a gate electrode connected to the second electrode of the tenth transistor; and
a $13^{th}$ transistor connected between the second node and the second power source input terminal and having a gate electrode connected to the second output terminal.

8. The stage circuit of claim 4, wherein the pull-down unit comprises:
a $14^{th}$ transistor and a $15^{th}$ transistor serially connected between the first node and the second power source input terminal and having gate electrodes connected to the second node;
a $16^{th}$ transistor connected between the second output terminal and the second power source input terminal and having a gate electrode connected to the fourth input terminal; and
a $17^{th}$ transistor and an $18^{th}$ transistor serially connected between the first node and the second power source input terminal and having gate electrodes connected to the fourth input terminal.

9. The stage circuit of claim 1,
wherein a carry signal of the previous stage is an (i−1)-th carry signal, and
wherein a carry signal of the next stage is an (i+1)-th carry signal.

10. A stage circuit comprising:
an output unit configured to supply a voltage of a first node to a first output terminal, to supply an i-th (i is a natural number) carry signal to a second output terminal, and to supply an i-th scan signal to a third output terminal in response to the voltage of the first node, a voltage of a second node, and a first clock signal supplied to a first input terminal;
a controller configured to control the voltage of the second node in response to the first clock signal supplied to the first input terminal;
a pull-up unit configured to control the voltage of the first node in response to a carry signal of a previous stage supplied to a second input terminal and a voltage of a first node of the previous stage supplied to a third input terminal; and
a pull-down unit configured to control the voltage of the first node in response to the voltage of the second node and a carry signal of a next stage supplied to a fourth input terminal,
wherein the pull-up unit comprises:
a first transistor having a first electrode connected to the second input terminal and a gate electrode connected to the third input terminal;
a second transistor having a first electrode and a gate electrode connected to a second electrode of the first transistor and a second electrode connected to the first node;
a third transistor having a first electrode connected to the first electrode of the first transistor and a gate electrode and a second electrode connected to the second output terminal; and
a fourth transistor having a first electrode and a gate electrode connected to the second input terminal and a second electrode connected to the first electrode of the first transistor.

11. A scan driver including stages respectively connected to scan lines and outputting one of a plurality of clock signals input from an external source as scan signals, wherein an i-th (i is a natural number) stage circuit among the stages comprises:
an output unit configured to supply a voltage of a first node to a first output terminal, to supply an i-th carry signal to a second output terminal, and to supply an i-th scan signal to a third output terminal in response to the voltage of the first node, a voltage of a second node, and a first clock signal supplied to a first input terminal;
a controller configured to control the voltage of the second node in response to the first clock signal supplied to the first input terminal;
a pull-up unit configured to control the voltage of the first node in response to an (i−1)-th carry signal of a previous stage supplied to a second input terminal and a voltage of a first node of the previous stage supplied to a third input terminal; and
a pull-down unit configured to control the voltage of the first node in response to the voltage of the second node and an (i+1)-th carry signal of a next stage supplied to a fourth input terminal,
wherein the pull-up unit comprises:
a first transistor having a first electrode connected to the second input terminal and a gate electrode connected to the third input terminal;
a second transistor having a first electrode and a gate electrode connected to a second electrode of the first transistor and a second electrode connected to the first node; and
a third transistor having a first electrode connected to the second electrode of the first transistor and a gate electrode and a second electrode connected to the second output terminal.

12. The scan driver of claim 11, wherein, when the (i−1)-th carry signal is supplied, the second input terminal is set to have a lower voltage than that of the third input terminal.

13. The scan driver of claim 11, wherein the pull-up unit further comprises a fourth transistor having a first electrode and a gate electrode connected to the second input terminal and a second electrode connected to the first electrode of the first transistor.

14. A scan driver including stages respectively connected to scan lines and outputting one of a plurality of clock signals input from an external source as scan signals, wherein an i-th (i is a natural number) stage circuit among the stages comprises:
- an output unit configured to supply a voltage of a first node to a first output terminal, to supply an i-th carry signal to a second output terminal, and to supply an i-th scan signal to a third output terminal in response to the voltage of the first node, a voltage of a second node, and a first clock signal supplied to a first input terminal;
- a controller configured to control the voltage of the second node in response to the first clock signal supplied to the first input terminal;
- a pull-up unit configured to control the voltage of the first node in response to an (i−1)-th carry signal of a previous stage supplied to a second input terminal and a voltage of a first node of the previous stage supplied to a third input terminal; and
- a pull-down unit configured to control the voltage of the first node in response to the voltage of the second node and an (i+1)-th carry signal of a next stage supplied to a fourth input terminal, wherein the pull-up unit comprises:
- a first transistor having a first electrode connected to the second input terminal and a gate electrode connected to the third input terminal;
- a second transistor having a first electrode and a gate electrode connected to a second electrode of the first transistor and a second electrode connected to the first node;
- a third transistor having a first electrode connected to the first electrode of the first transistor and a gate electrode and a second electrode connected to the second output terminal; and
- a fourth transistor having a first electrode and a gate electrode connected to the second input terminal and a second electrode connected to the first electrode of the first transistor.

\* \* \* \* \*